United States Patent
Coenen et al.

(10) Patent No.: US 9,516,731 B2
(45) Date of Patent: Dec. 6, 2016

(54) POWER SUPPLY FOR A DISCHARGE PRODUCED PLASMA EUV SOURCE

(75) Inventors: Martinus Jacobus Coenen, Eindhoven (NL); Guido Friedrich Siemons, Stolberg (DE)

(73) Assignees: ASML NETHERLANDS B.V., Veldhoven (NL); USHIO DENKI KABUSHIKI KAISHA, Tokyo-To (JP)

( * ) Notice: Subject to any disclaimer, the term of this patent is extended or adjusted under 35 U.S.C. 154(b) by 333 days.

(21) Appl. No.: 14/131,869

(22) PCT Filed: Apr. 19, 2012

(86) PCT No.: PCT/EP2012/057140
§ 371 (c)(1),
(2), (4) Date: Oct. 6, 2014

(87) PCT Pub. No.: WO2013/007407
PCT Pub. Date: Jan. 17, 2013

(65) Prior Publication Data
US 2015/0022795 A1    Jan. 22, 2015

Related U.S. Application Data

(60) Provisional application No. 61/507,368, filed on Jul. 13, 2011.

(51) Int. Cl.
| | |
|---|---|
| G03B 27/54 | (2006.01) |
| G03B 27/72 | (2006.01) |
| H05G 1/10 | (2006.01) |
| H05G 2/00 | (2006.01) |
| G03F 7/20 | (2006.01) |
| H04L 25/02 | (2006.01) |

(52) U.S. Cl.
CPC .......... H05G 2/008 (2013.01); G03F 7/70033 (2013.01); G03F 7/70991 (2013.01); H04L 25/0278 (2013.01); H05G 2/003 (2013.01)

(58) Field of Classification Search
CPC .................. G03F 7/70033; H05G 1/085–1/24; H05G 2/00–2/008
USPC .............................. 355/67, 69; 378/101–112
See application file for complete search history.

(56) References Cited

U.S. PATENT DOCUMENTS

| | | |
|---|---|---|
| 4,267,538 A | 5/1981 | Assal et al. |
| 6,342,815 B1 | 1/2002 | Kobayashi |

(Continued)

FOREIGN PATENT DOCUMENTS

| | | |
|---|---|---|
| EP | 0 613 169 | 8/1994 |
| JP | 2-78199 | 3/1990 |

(Continued)

OTHER PUBLICATIONS

International Search Report mailed Aug. 7, 2012 in corresponding International Patent Application No. PCT/EP2012/057140.

*Primary Examiner* — Colin Kreutzer
(74) *Attorney, Agent, or Firm* — Pillsbury Winthrop Shaw Pittman LLP

(57) ABSTRACT

A power supply for providing HV power to a lithography illumination source comprising a HV power source arranged to provide the HV power, a HV power transmission line arranged to transmit the HV energy from the HV power source and one or more RF terminations provided on one or more of an input end of the transmission line or an output end of the transmission line. The one or more RF terminations terminate the transmission line to reduce reflection of RF energy at the end of the transmission line.

20 Claims, 16 Drawing Sheets

(56) References Cited

U.S. PATENT DOCUMENTS

| | | | |
|---|---|---|---|
| 7,456,516 | B2 | 11/2008 | Suzuki |
| 2001/0055104 | A1 | 12/2001 | Irie |
| 2005/0200304 | A1 | 9/2005 | Korobochko et al. |
| 2007/0075256 | A1 | 4/2007 | Buller et al. |
| 2008/0067453 | A1 | 3/2008 | Ivanov et al. |

FOREIGN PATENT DOCUMENTS

| | | |
|---|---|---|
| JP | 2006-324039 | 11/2006 |
| JP | 2007-088061 | 4/2007 |
| JP | 2004-304365 | 10/2008 |
| JP | 2010-268154 | 11/2010 |

US 9,516,731 B2

1

POWER SUPPLY FOR A DISCHARGE PRODUCED PLASMA EUV SOURCE

CROSS-REFERENCE TO RELATED APPLICATIONS

This application is the U.S. national phase entry of International Patent Application No. PCT/EP2012/057140, filed Apr. 19, 2012, which claims the benefit of U.S. provisional application 61/507,368, which was filed on Jul. 13, 2011, both of which are incorporated herein in their entireties by reference.

FIELD

Embodiments relate to a HV power supply for supplying power to a lithography illumination source, such as an extreme ultraviolet radiation source, to a lithography illumination source including such a power supply and to a lithographic apparatus incorporating such an illumination source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range

2 of 13-14 nm, or example within the range of 5-10 nm such as 6.7 nm or 6.8 nm. Possible radiation sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

SUMMARY OF THE INVENTION

According to an aspect of the invention, there is provided a power supply for providing power to a lithography illumination source. The power supply comprises a voltage source arranged to provide the power, a transmission line arranged to transmit the power from the voltage source and one or more RF terminations provided on one or more of an input end of the transmission line or an output end of the transmission line. The one or more RF terminations terminating the transmission line to reduce reflection of RF energy at the end of the transmission line.

According to another aspect of the invention, there is provided an apparatus comprising a voltage source and a lithography illumination source connected to the voltage source via a transmission line. An end of the transmission line is connected to a matching network to reduce RF reflection at the end.

According to another aspect of the invention, there is provided an apparatus comprising a voltage source, a lithography illumination source connected to the voltage source via a transmission line and an RF isolator between the illumination source and the voltage source.

According to an aspect of the invention, there is provided a lithographic apparatus comprising an aforementioned apparatus.

According to an aspect of the invention, there is provided a voltage source for supplying voltage to a lithography illumination source comprising an output port with a RF termination for connecting to a transmission line having a characteristic impedance. The RF termination provides a termination impedance at the output port, as seen by the transmission line, that substantially corresponds to the characteristic impedance of the transmission line.

According to another aspect of the invention, there is provided a method of creating extreme ultraviolet radiation, hereinafter referred to as EUV radiation. The method comprises connecting a voltage source to an EUV radiation source via an RF isolator and continuously charging a capacitor within the EUV radiation source with a DC current from the voltage source while the EUV radiation source intermittently discharges the capacitor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
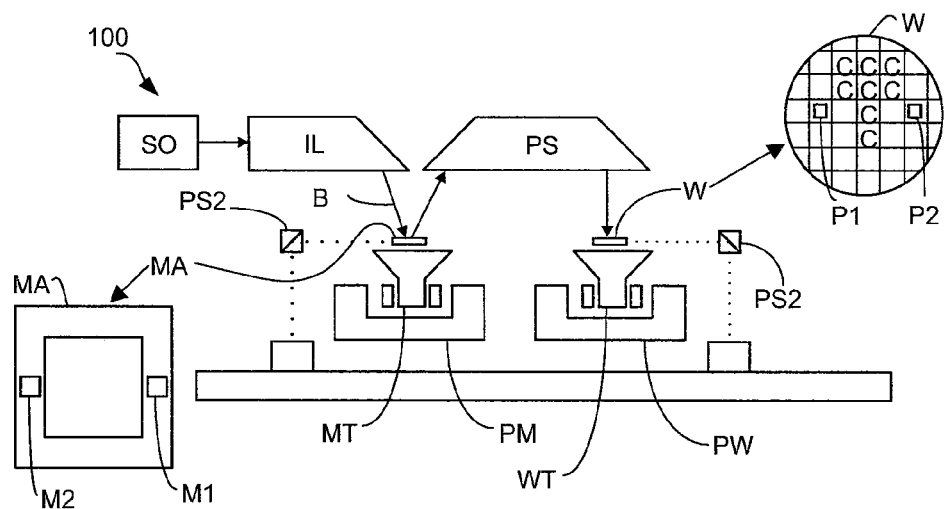
FIG. 1 depicts a lithographic apparatus according to an embodiment of the invention.

FIG. 1 schematically depicts a lithographic apparatus 100 including a source collector module SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror or MEMS-based arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
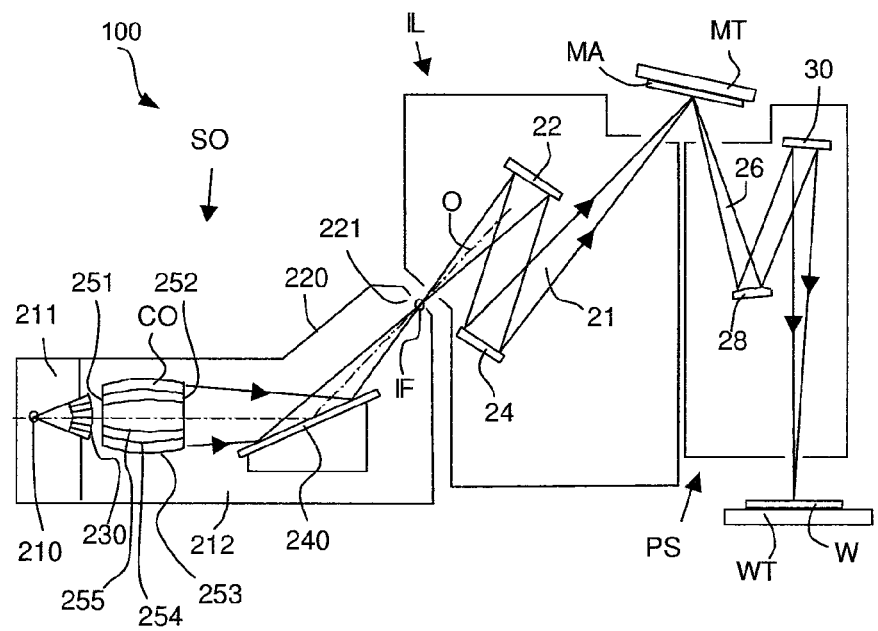
FIG. 2 is a more detailed view of the apparatus of FIG. 1, including a discharge produced plasma ("DPP") source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or (rotating) foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
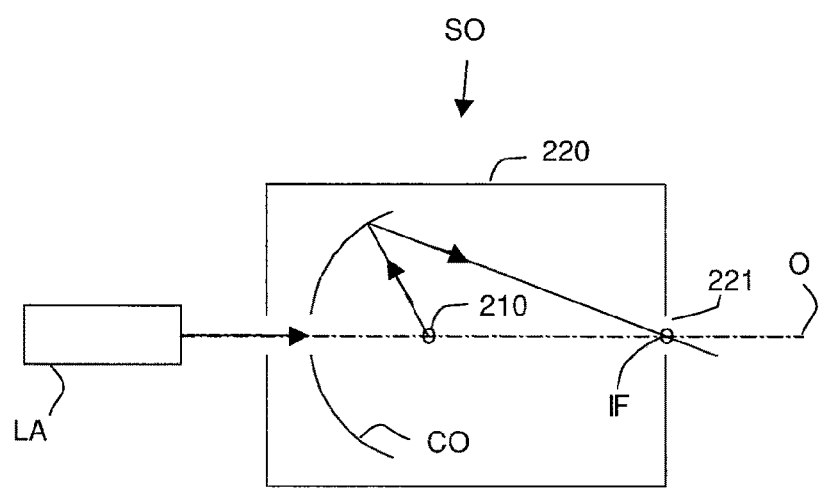
FIG. 3 is a view of an alternative source collector module of the apparatus of FIG. 1, the alternative being a laser produced plasma ("LPP") source collector module.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4A:
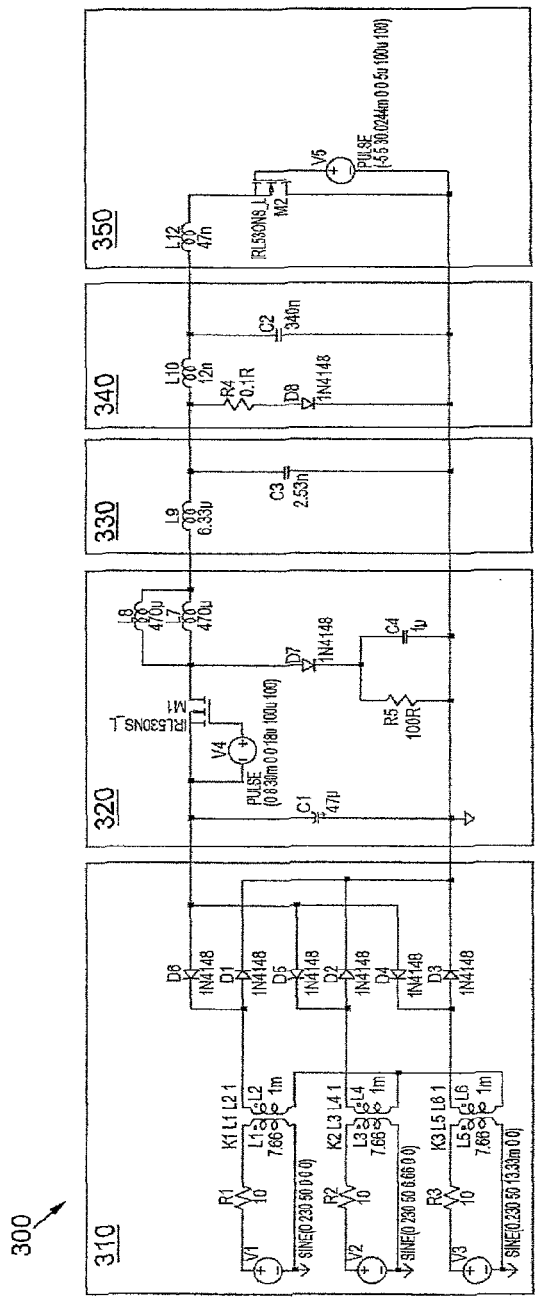
FIGS. 4A and 4B show a known arrangement for applying an electric pulse to the electrodes of an extreme ultraviolet radiation source.
Figure 4B:
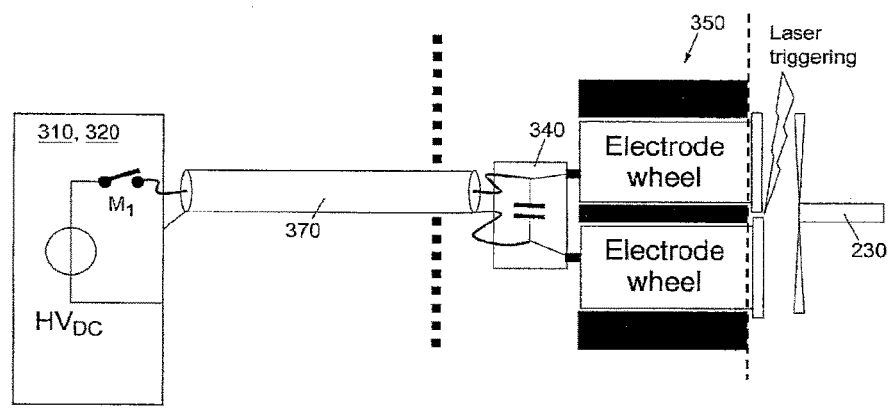

FIGS. 4A and 4B show equivalent circuit diagrams of a known power source 300 for supplying electric HV energy to an extreme ultraviolet radiation source (e.g. a DPP source). The circuit is supplied with energy by the three phase HV voltage supply 310. As can be seen, the HV energy source 310 comprises a rectifying arrangement, so that the energy source 310 represents a HV DC power supply. The DC voltage is supplied via a switching circuit 320, an RF cable 330 and a capacitor bank 340 to the EUV source 350. The individual components in this transmission chain will be described in the following, starting with the EUV source 350.

The EUV source 350 may be any known type of EUV source and is represented by an inductor $L_{12}$ and a switching arrangement comprising a pulsed power source $V_5$ coupled to the gate of a FET $M_2$ (to represent the discharge sequences). The inductor L12 represents the inductance of the EUV electrode. The FET $M_2$ and the pulsed power source $V_5$ are an equivalent representation, for the purpose of electric circuit simulation, of repeated arc discharges occurring between the electrodes of the EUV source in use.

The EUV source 350 obtains its input power from the capacitor bank 340. The capacitor bank 340 comprises one or more parallel capacitors $C_2$. These capacitors $C_2$ store the energy provided by the energy supply 310 and support the arc discharge via the EUV source's 350 electrodes at the appropriate time, e.g. when sufficient EUV source fuel is provided between the electrodes of the EUV source.

The capacitor bank 340 also comprises an overvoltage and reverse voltage protection circuit comprising the series network of the resistor $R_4$ and diode $D_8$. The inductor $L_{10}$ represents the intrinsic inductance of the interconnecting system. It will be appreciated that the capacitor(s) $C_2$ are charged whenever energy is provided through the RF cable 330 and discharged whenever an arc discharge occurs between the electrodes of the EUV source 350.

The circuit model shown in FIG. 4A represents the RF cable 330 in a standard way, as a low pass filter comprising the capacitor $C_3$ and the inductor $L_9$.

A switching circuit 320 is provided between the RF cable 330 and the energy supply 310. The switching circuit 310 comprises a capacitor $C_1$ for continuously storing energy provided by the power supply 310. The inductors $L_7$ and $L_8$ represent the additional inductance in series with the switching circuit 320. The network comprising diode $D_7$, resistor $R_5$ and capacitor $C_4$ form an overvoltage protection circuit.

The pulsed voltage source $V_4$ and the FET $M_1$ of the switching circuit 320 are, in contrast to the pulsed voltage source $V_5$ and the FET $M_2$ of the EUV source 350, not merely representative of a physical effect in the system but instead a representation of components physically present in the switched power supply 320. The switching circuit 320 is provided as a means for intermittently interrupting the charging of the capacitor bank $C_2$ to allow $C_2$ to be discharged by the arc discharge at the EUV source 350. A discharging of the capacitor $C_2$ following an arc discharge was thought to be desirable to prevent arching at the electrodes of the EUV source 350 that does not create extreme ultraviolet radiation. To achieve this, the pulsed voltage source is arranged so that it does not switch the FET $M_1$ to a conducting state while the FET $M_2$ is in a conducting state, i.e. while arc discharge is occurring within the EUV source 350. Thus, the arc discharge at the electrodes of the EUV source 350 can discharge the capacitor $C_2$. A subsequent switching of the FET $M_1$ to a conducting state by the pulsed voltage source $V_4$ then recharges the capacitor $C_2$ in preparation for the next arc discharge.

FIG. 4B shows a simplified version of the device, simplifying for clarity, some of the circuit components shown explicitly in FIG. 4A. The nature of a suitable EUV source 350 can, for example be more readily discerned from FIG. 4B. In this example the EUV source 350 is one of the know EUV sources available, for example, from XTREME technologies, Konrad-Zuse-Straße 1, 52477 Alsdorf, Germany. It will, however, be appreciated that other EUV sources may instead be used as part of the present invention. As can be seen from FIG. 4B, the capacitor bank 340 and the EUV source 350 are contained in a cabinet providing the necessary vacuum atmosphere. The cabinet could further be used to provide RF screening. The component indicated with reference number 230 corresponds to the above mentioned (rotating) foil trap.

In the circuit shown in FIGS. 4A and 4B, the maximum voltage change achievable was about 4 kV in 10 ns. This placed a burdensome upper limit on the maximum operating frequency of the EUV source 350, as it governed the discharging and charging of the capacitor $C_2$.

Figure 5A:
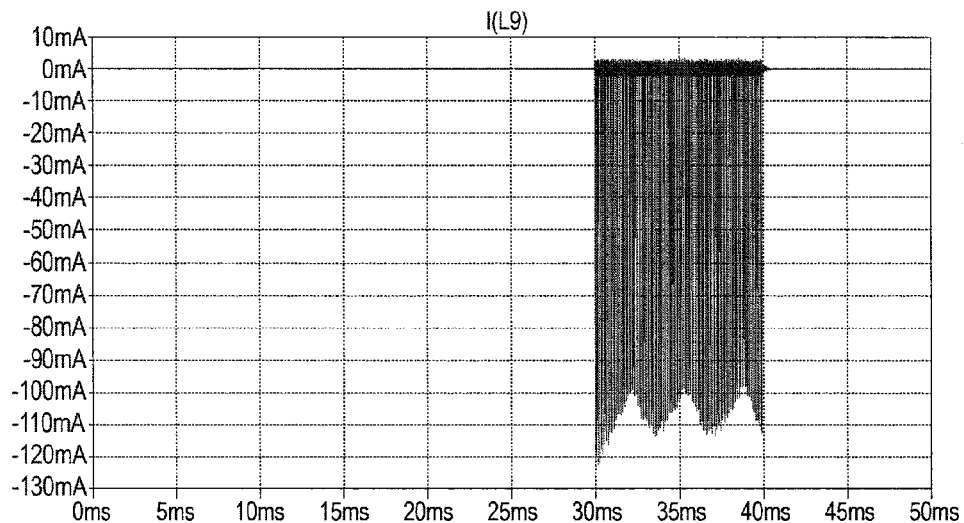
FIGS. 5a and 5b show simulation results based on the circuit architecture shown in FIG. 4.
Figure 5B:
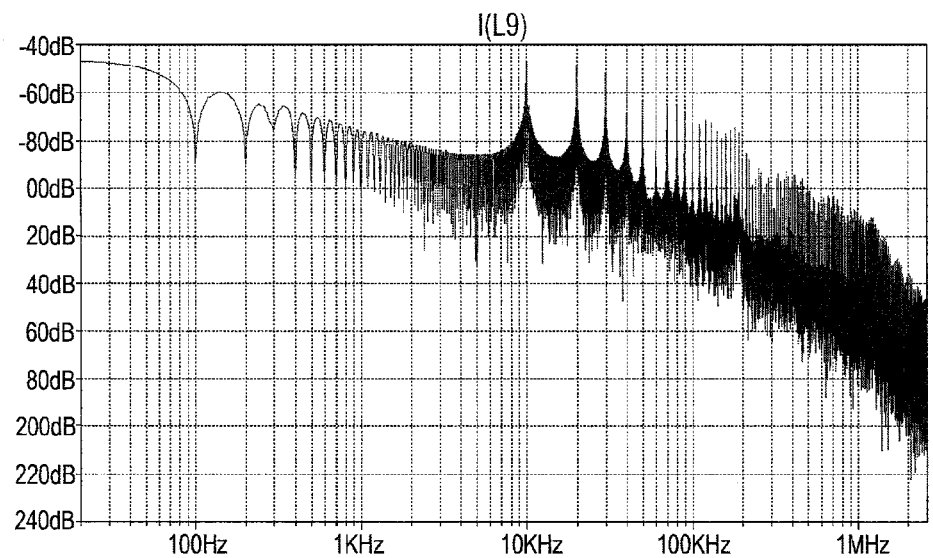

FIGS. 5a and 5b shows the result of a computer simulation of the circuit shown in FIG. 4A. FIG. 5a shows the current flowing to the electrodes of the EUV source 350 following the start of the arc discharge at time ~30 ms. As can be seen from FIG. 5a, the arc discharge may last 10 ms. After its termination at 40 ms, an acceptably short (less than 1 ms) ringing artefact is experienced.

FIG. 5b shows the frequency composition of the current shown in FIG. 5a. As can be seen from FIG. 5b, a number of resonances are present within the circuit.

Comparing the simulation results of FIGS. 5a and 5b with experimental observations, however, indicated that the equivalent circuit diagram of FIG. 4A does not fully reflect the real life behaviour of the circuit. The inventor has in particular observed that a high frequency resonance present in the real life apparatus is not replicated by simulations based on the FIG. 4A equivalent circuit. It is desirable to replicate this resonance in the simulation to verify the accuracy of the equivalent circuit underlying the simulation.

Figure 6:
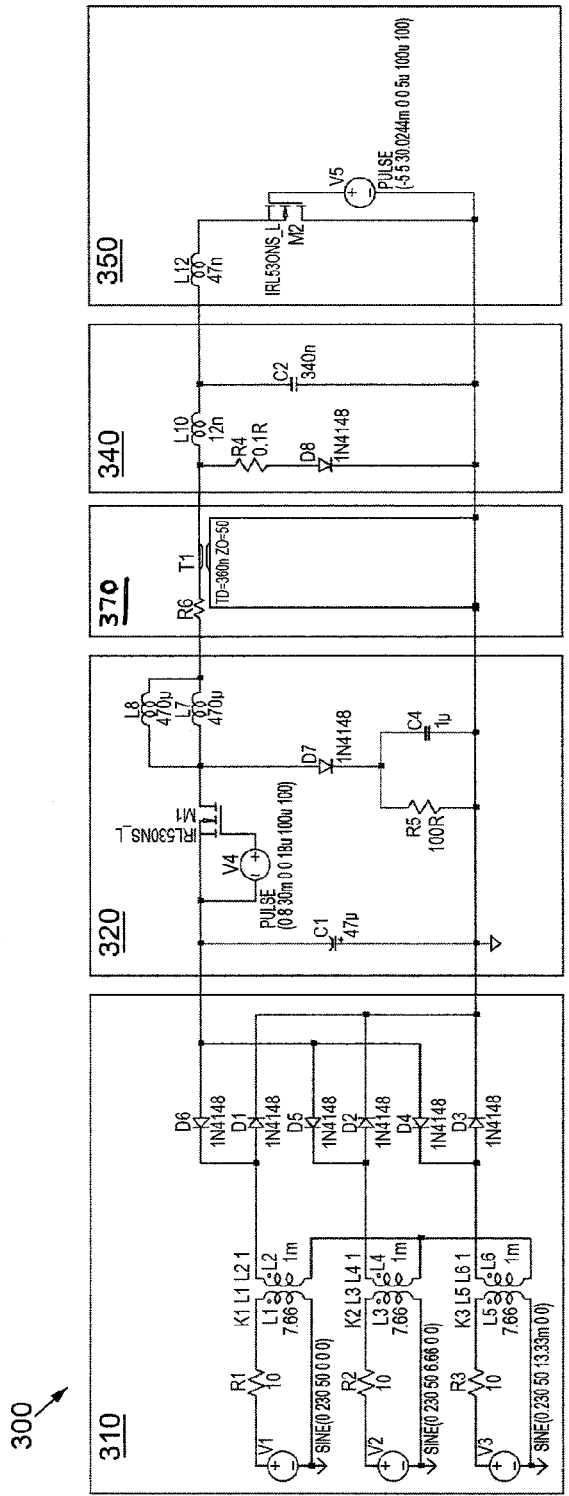
FIG. 6 shows the circuit diagram of FIG. 4A with a modification in accordance with an embodiment of the invention.

In view of the above discussed discrepancy between the simulation results and experiments, the inventor has modified the equivalent circuit shown in FIG. 4A by replacing the low pass filter that had represented the RF cable 330 in FIG. 4A with a transmission line $T_1$ to form the equivalent RF cable 370 shown in FIG. 6. In an embodiment, the RF cable 370 may be a coaxial cable having a core and a shield. None of the other components of the power source 300 was changed. The transmission line T1 has a characteristic impedance of $Z_0=50\Omega$ and introduces a propagation delay time of $T_d=350$ ns.

Figure 7A:
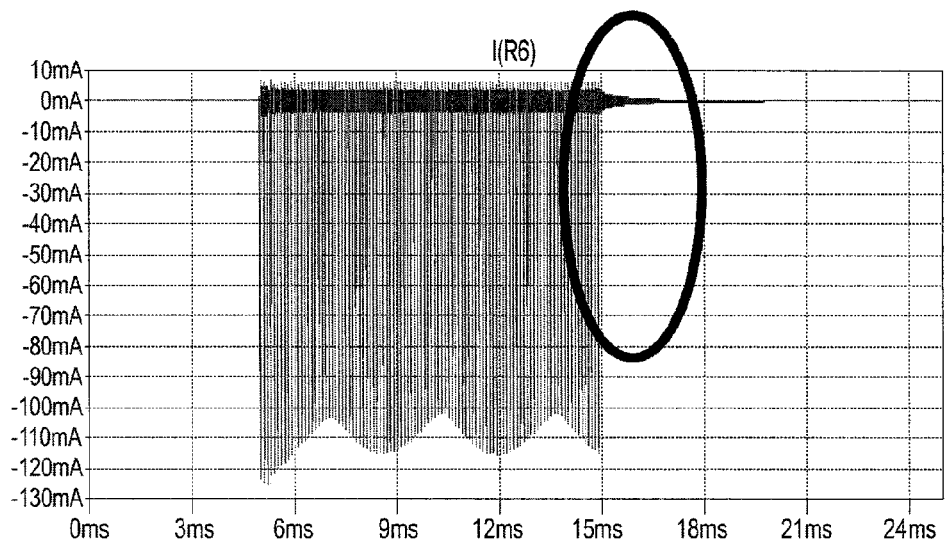
FIGS. 7a and 7b show simulation results based on the circuit architecture shown in FIG. 4, but derived from the model as shown in FIG. 6.
Figure 7B:
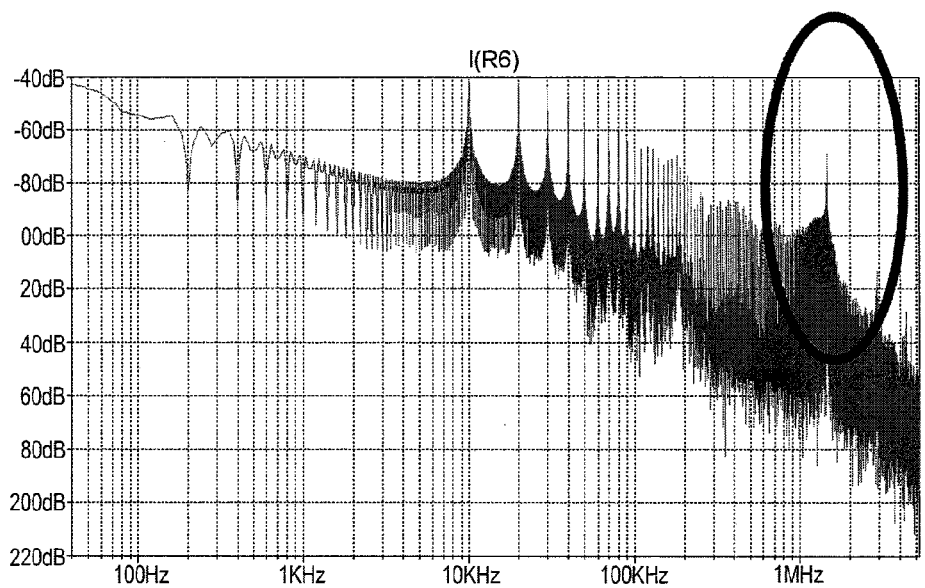

The results of simulations based on the equivalent circuit of FIG. 6 are shown in FIGS. 7a and 7b. As can be seen from FIG. 7a, after the termination of the arc discharge at the EUV source at 15 ms, significant current flow is experienced for about 4 ms. An additional resonance moreover is manifest at approximately 1.5 MHz, as shown in FIG. 7b. This additional resonance is similar to a thus far unexplained resonance experienced in real life circuits, although it will of course be appreciated that the exact frequency of this parasitic resonance will always depend on the exact values of the components and of effects present in the circuitry considered.

The inventor has found that this resonance is caused by an RF signal that is generated by the intermittent discharge of the capacitor $C_2$ by the arc discharge at the electrodes of the EUV source 350. This RF signal propagates from $C_2$ through the RF cable 370 towards the switching circuit 320 and is reflected there because of the high impedance/open circuit presented to the RF cable 370 by the switching circuit 320. The reflected signal returns through the RF cable 370 to the capacitor $C_2$, creating a standing wave within the coaxial cable.

While EUV power sources can be and have been operated in practice despite this effect, the presence of this phenomenon indicates a waste of energy. A means for suppressing this phenomenon is shown in FIG. 8A.

Figure 8A:
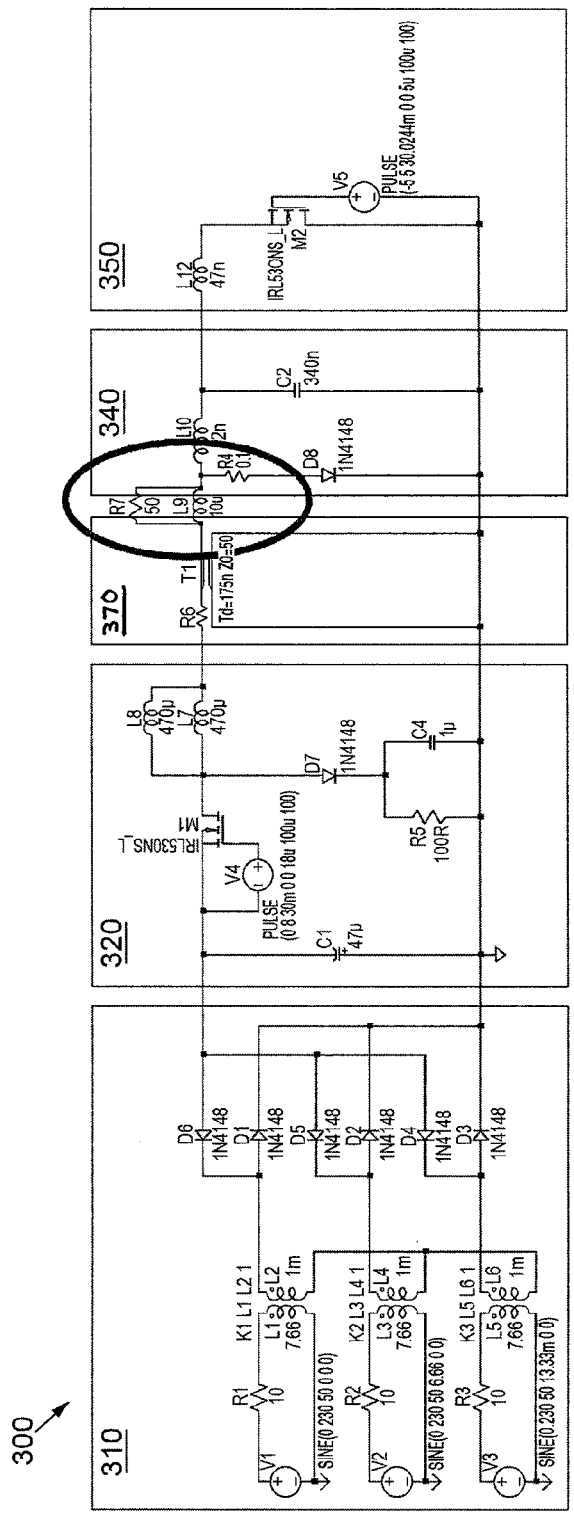
FIGS. 8A and 8B show a circuit diagram of an extreme ultraviolet radiation source according to an embodiment.

As can be seen from FIG. 8A, the circuit of the EUV power source 300 corresponds to the circuit shown in FIG. 6 but comprises one additional network component, a parallel circuit comprising a resistor $R_7$ and an inductor $L_9$. The resistor $R_7$ terminates the RF cable 370 with its characteristic impedance, 50Ω, so that the input impedance of the capacitor bank 340 when combined with the parallel $R_7/L_9$ network and as seen from the RF cable 370, is 50Ω. Any RF signal reflected by the switching circuit 320 is dissipated in this termination, so that it cannot contribute to the standing wave. The capacitor $C_2$ can nevertheless be charged by the HV voltage supply 310/switching circuit 320 as the inductor $L_9$ provides a DC path for this purpose.

The presence of the parallel network $R_7/L_9$ does not prevent the above discussed RF signal generated by the arc discharge of $C_2$ at the electrodes of the DPP EUV source 350 from propagating towards the switching circuit 320. A signal that has been reflected at the switching circuit 320 and that has subsequently propagated back to the $R_7/L_9$ network is attenuated in this network. Any effect that the RF signal created by the arc discharge in the EUV source 350 may have is eliminated at this point, i.e., after two propagation delays caused by the length of the RF cable.

From the above, it will be appreciated that in an alternative arrangement the parallel $R_7/L_9$ network could be located at the upstream end of the RF cable 370, that is at the interface of the switching circuit 320 and the RF cable 370. In this case the RF signal propagating from $C_2$ towards the HV power source back would be dissipated at $R_7$ after a time shift caused by a propagation delay corresponding to that introduced by a single length of the RF cable 370. Alternatively, two parallel $R_7/L_9$ networks could be used, one at each end of the RF cable 370.

Figure 8B:
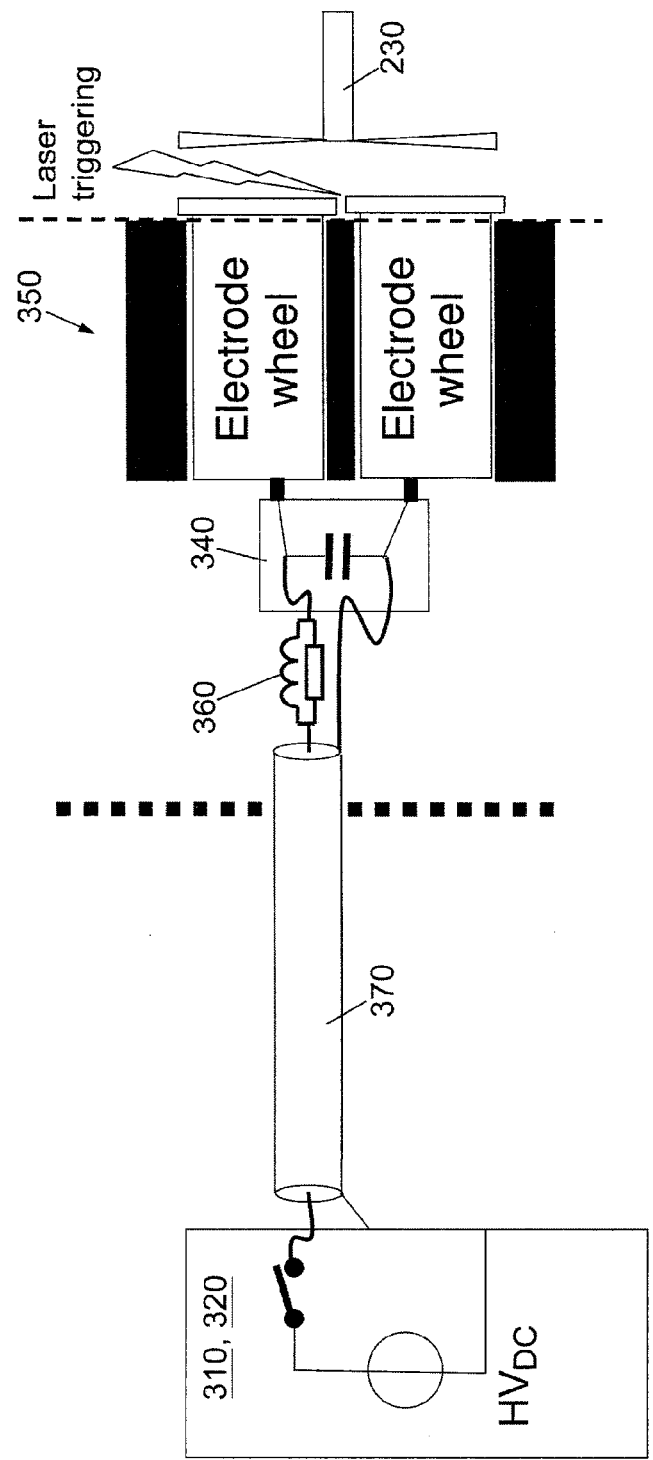

FIG. 8B provides a more schematic illustration of the embodiment in FIG. 8A. As can be seen from FIG. 8B, the RF-termination 360 comprising the inductor $L_9$ and resistor R7 shown in FIG. 8A is located inside the cabinet surrounding the DPP EUV source 350 and the capacitor bank 340. In this way the RF shield provided by the cabinet and the shield of the coaxial cable 370 is continuous.

Figure 9A:
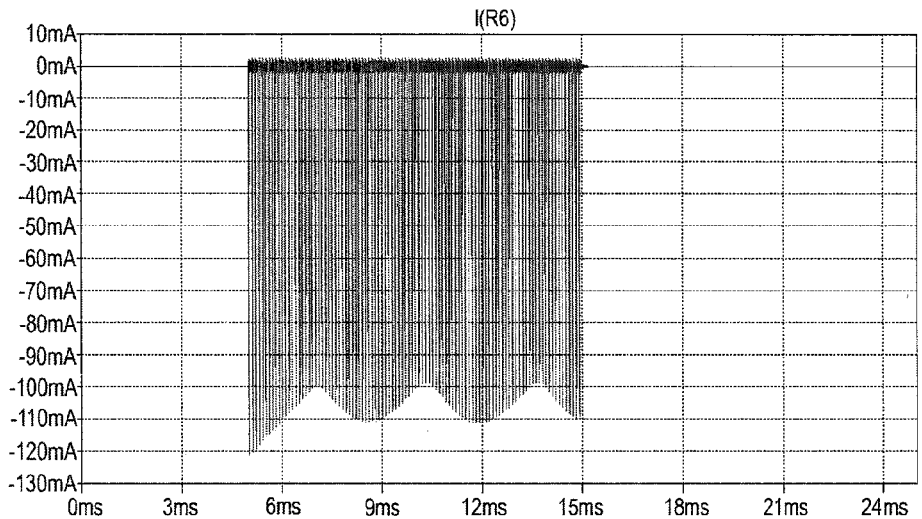
FIGS. 9a and 9b show simulation results of the voltage at the terminals of the EUV source for the FIG. 8A circuit.
Figure 9B:
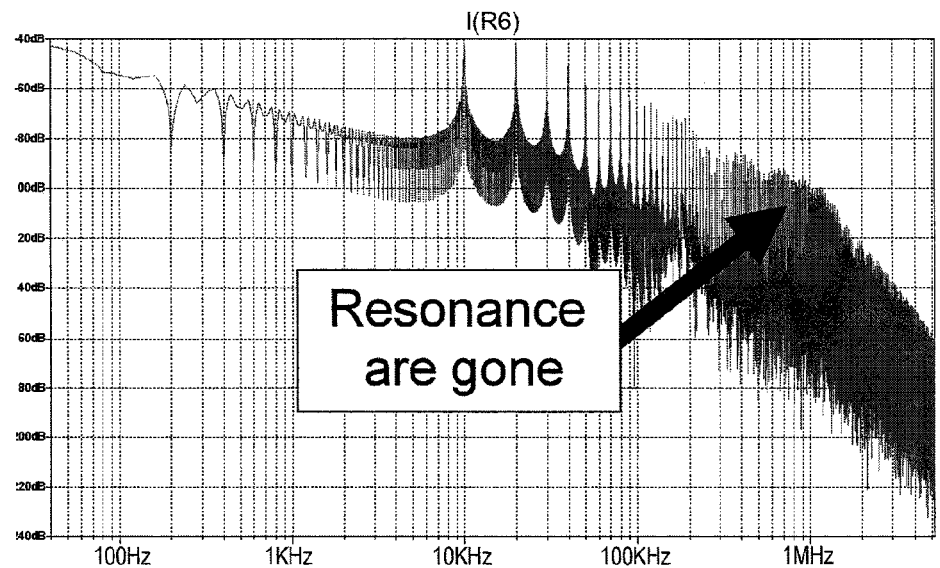

FIGS. 9A and 9B show simulations results based on the FIG. 8A equivalent circuit. As can be seen from FIGS. 9A and 9B, the 1.5 MHz resonance present in FIG. 7b as well as the ringing shown in FIG. 7a have been eliminated by the introduction of the parallel $R_7/L_9$ circuit. To verify the accuracy of these simulation results the $R_7/L_9$ matching circuit has been introduced in the corresponding location in a real life power source and the frequency behaviour of the so modified power source was investigated. This investigation has confirmed that the undesirable resonance that had previously been experienced is suppressed by the presence of the matching circuit, as predicted by the simulations.

The presence of the parasitic resonance eliminated in the embodiment had placed an upper limit on the operating frequency of the EUV source. The origin of this limitation is now understood and will be discussed in the following.

As confirmed by the above discussed simulations, the resonance was created by standing waves on the coaxial cable. Trace 400 in FIG. 10A and trace 430 in FIG. 10B show the frequency distribution of a ringing current on the RF coaxial cable 370 and the voltage distribution over time of such ringing respectively, as simulated using the FIG. 6 equivalent circuit. As can be seen from trace 400, a large number of resonances with high current intensity are present on the cable. Trace 430 moreover indicates that high ringing voltages are present on the coaxial cable 370 for a considerable period of time. Current designs of EUV sources using tin as a fuel material require a voltage of about 2.7-3 kV to create an EUV generating arc discharge. As will be appreciated from FIG. 10B, this voltage is periodically exceeded by the ringing on the RF coaxial cable 370 with consequential re-arching within the DPP EUV source 350. Such re-arching does not give rise to EUV radiation and is thus undesirable. Prior to this present invention having been made it was thus practice to only induce an EUV radiation generating arching in the EUV source 350 once the ringing on the RF coaxial cable had died down. This practice introduced a delay period which may be avoided by the circuit shown in FIG. 8A. It will moreover be appreciated that after the end of the ringing period indicated in FIG. 10B, the charges stored in capacitor bank 340 are likely insufficient to support such EUV radiation generating arching, so that a further delay was introduced by a need to re-charge the capacitor bank 340 prior to generating the desired EUV radiation generating arc. The ringing highlighted by the simulations thus place an upper limit on the repeat frequency of the DPP EUV source 350 creating EUV generating arching.

Moreover, as will be appreciated from trace 430 of FIG. 10B, a considerable amount of energy is involved in the ringing on the coaxial cable 370. Not only is this energy not put to use in creating EUV radiation (and is therefore wasted) but this ringing also creates RF radiation that may radiate outside of the shield of the coaxial cable, thus posing a potential electromagnetic safety risk.

Figure 10A:
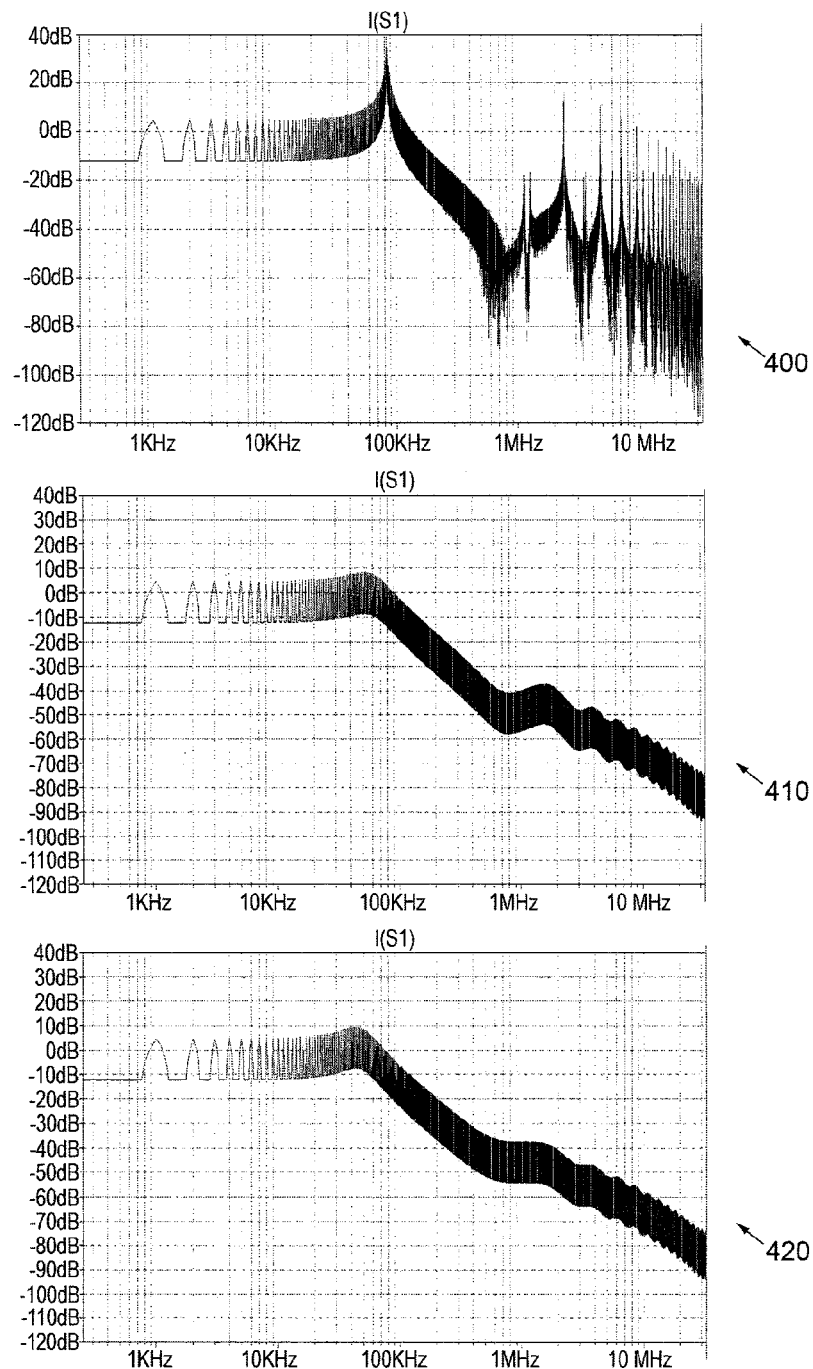
FIGS. 10A and 10B illustrate the properties of a ringing current on a coaxial cable in the circuits of FIGS. 6, 8, 11 and 12.
Figure 10B:
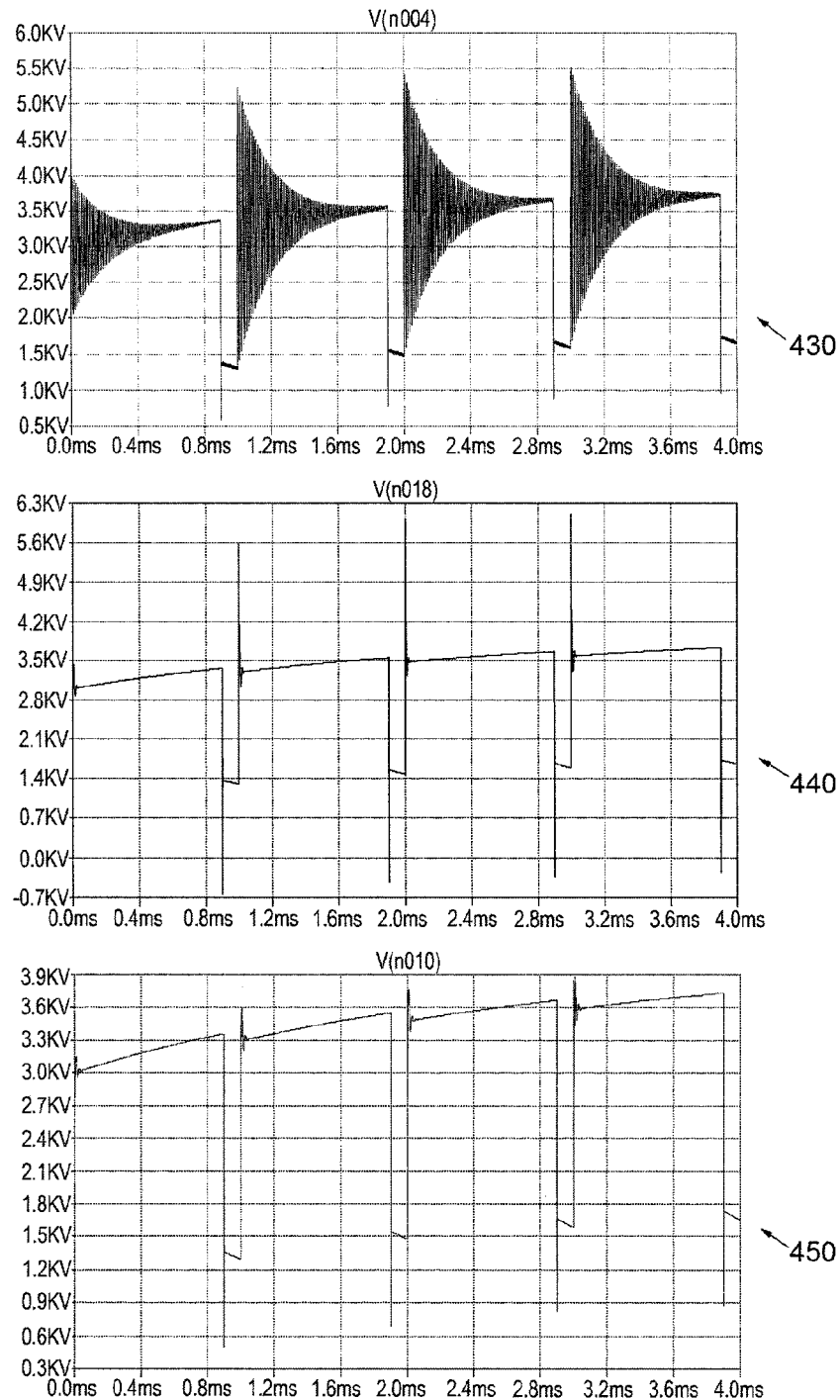

FIGS. 10A and 10B also show the current flowing on the RF coaxial cable in the FIG. 8A and 8B embodiment. The relevant traces are labelled 410 and 440 respectively. As can be seen from FIG. 10B, both the duration of any ringing as well as the amplitude of the ringing voltage is considerably reduced, thus supporting a reduction of the time separating EUV radiation generating arching and consequently supporting an increase in operating frequency. The reduction of the amplitude of the ringing current moreover means that electromagnetic radiation from the coaxial cable is reduced and that less power is wasted in ringing phenomena.

Figure 11:
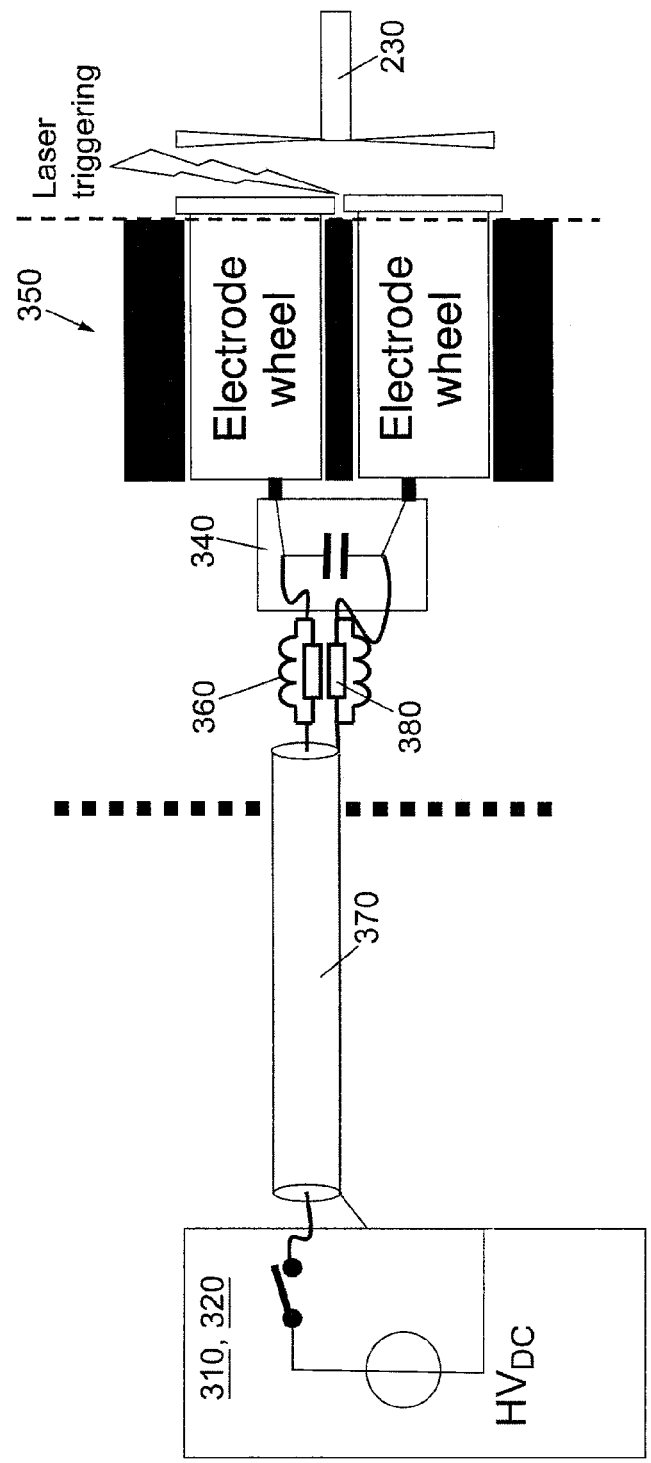
FIG. 11 shows a circuit diagram of an extreme ultraviolet radiation source according to another embodiment, having a symmetrical termination.

FIG. 11 shows a further embodiment. This embodiment corresponds to the embodiment shown in FIGS. 8A and 8B but includes a second RF termination circuit 380 connected between the shield of the RF cable 370 and the second electrode of the DPP EUV source 350 (which before had been connected to ground potential through the shield of the RF coaxial cable 370 in the FIG. 8A and 8B embodiment). This RF termination circuit 380 comprises, in this embodiment, the same components as the RF termination circuit 360, in the same configuration. A voltage increase on the electrode of the DPP EUV source 350 that is connected to the core of the coaxial cable 370 consequently leads to a voltage increase on this second electrode. The presence of the second RF termination circuit 380 thus increases the electrical balance of the DPP EUV source 350.

Figure 12:
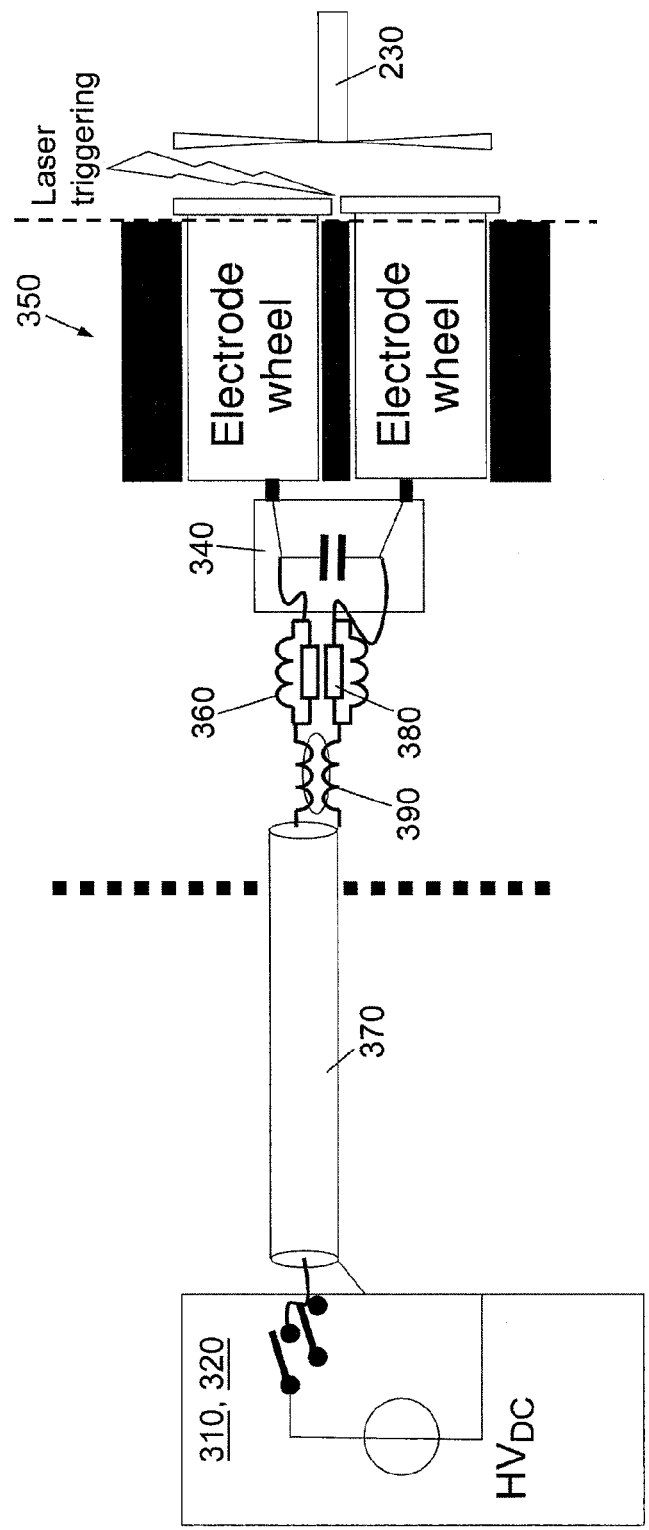
FIG. 12 shows a circuit diagram of an extreme ultraviolet radiation source according to a further embodiment, having a symmetrical termination and further balancing at the electrodes during discharges.

FIG. 12 shows a further improvement, wherein a balanced to unbalanced transformer 390 (BALUN) or common mode choke is used at the downstream end of the coaxial cable 370. The BALUN converts the signal on the coaxial cable 370, which is unbalanced with respect to ground, into a signal within the DPP EUV source 350 that is balanced with respect to ground. The BALUN 390 passes differential (equal but opposite) currents on the branches connected to the core and shield of the coaxial cable 370 respectively. It will be appreciated that it is not essential to use the BALUN 390 in conjunction with both of the RF terminations 360 and 380. The RF termination 370 may be omitted. If an RF termination is connected between the core of the RF coaxial cable 370 and the switching circuit 320, or as part of the switching circuit 320, then no RF termination may be needed at the capacitor bank 340 side of the RF coaxial cable 370. Traces 420 and 450 of FIGS. 10A and 10B show the ringing behaviour achievable if circuits such as those shown in FIGS. 11 and 12 are used. Simulations have shown that, while the circuitry of FIG. 4A can give rise to currents of up to 700A on the coaxial cable, the current on the coaxial cable of the FIG. 12 embodiment can be as low as 900 mA.

Figure 13:
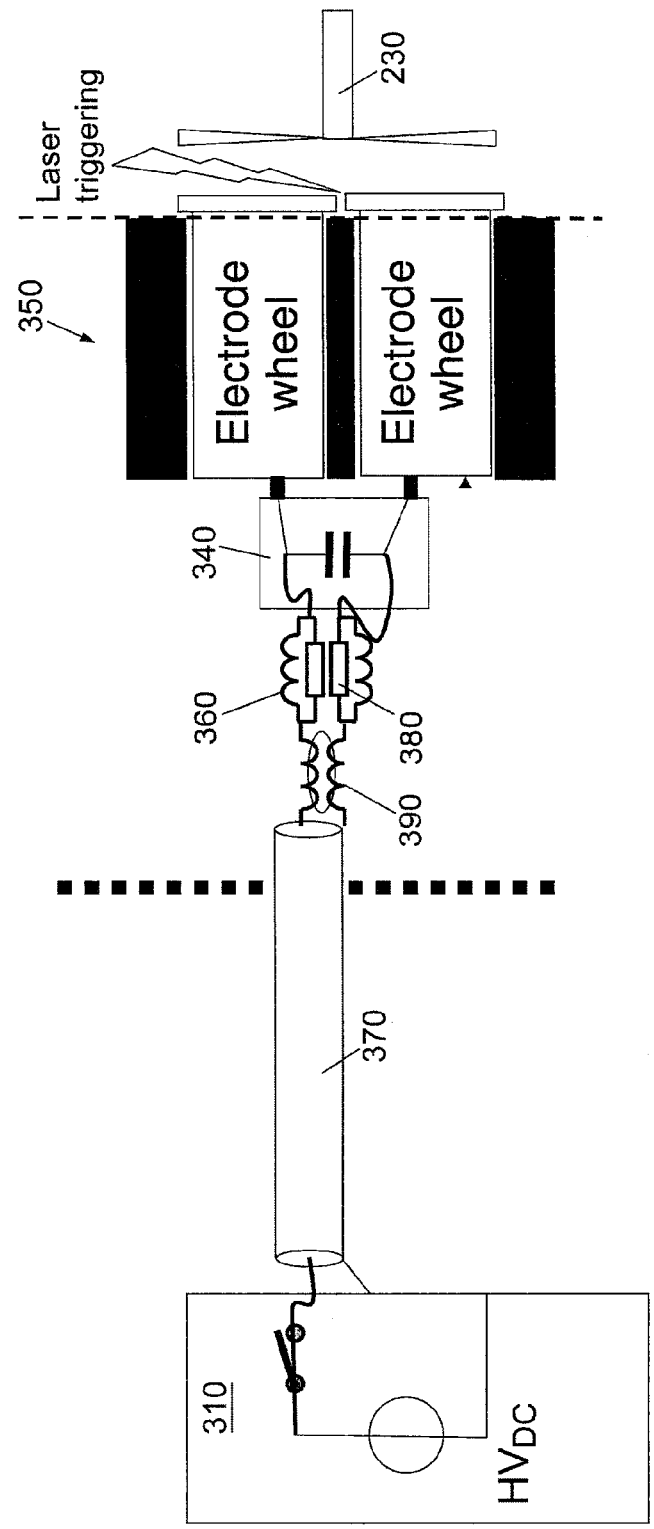
FIG. 13 shows a circuit diagram of an extreme ultraviolet radiation source according to a further embodiment where the disconnection from the HV source is eliminated.

It will be appreciated from FIGS. 10A and 10B that all of the embodiments provide a considerable reduction in ringing and effectively provide an RF separation of the capacitor bank 340 from the HV voltage supply 310/320. As a consequence the switching circuit 310 can be dispensed with in one embodiment, so that the power source 310 is directly connected to the RF cable, for continuous DC charging of the capacitor bank 340 through the inductor $L_9$. This reduced the period between EUV generating arching events within the DPP EUV source 350 further, thus providing further potential for increasing the operating frequency of the DPP EUV source 350 and consequently the total EUV radiation energy that can be output by the DPP EUV source 350. An embodiment in which the switching circuit 320 is eliminated is shown in FIG. 13, where the switching circuit 320 is schematically shown as being short circuited. In reality the switching circuit 320 would of course simply be omitted. The power source is consequently simplified in this embodiment.

Figure 14:
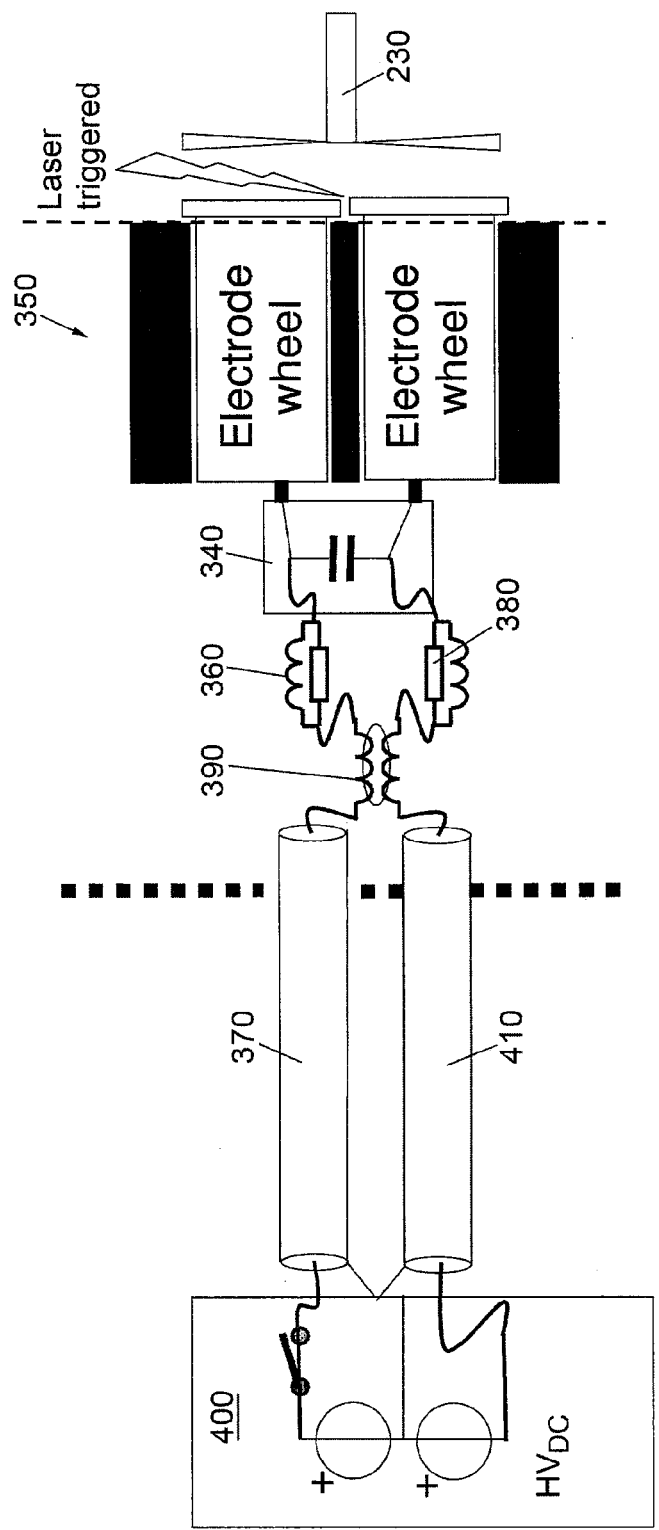
FIG. 14 shows a circuit diagram of an extreme ultraviolet radiation source according to a further embodiment where the disconnection from the HV source is eliminated and made symmetrical.

In the embodiment shown in FIG. 14 the unbalanced HV voltage supply 310 used in the preceding embodiments is replaced by a balanced power supply 400. The voltages provided by this balanced power supply 400 are equal and opposite with respect to ground. Two RF coaxial cables 370 and 410 are used for connecting the opposite polarity outputs of the power supply 400 to the cabinet of the DPP EUV source 350. The shields of the coaxial cables 370 and 410 are grounded. The cores of the two coaxial cables 370 and 410 are connected through a BALUN 390, which in turn is connected to two RF terminations 360 and 380. The BALUN 390 may, in another embodiment, be omitted in light of the balanced nature of the voltages received at the output side of the RF coaxial cables 370 and 410. It will moreover be appreciated that the RF terminations can alternatively or additionally be provided on the input ends of the coaxial cables 370 and/or 410. As shown in FIG. 13, no switching circuit is used in this embodiment, although a switching circuit modified to switch one or both of the voltages provided by the power supply 400 could be used. The use of a balance power supply has the additional advantage that the maximum voltages used within the DPP EUV source 350 can be kept lower than is possible if an unbalanced source is used, while still ensuring that the voltage difference between the electrodes of the DPP EUV source 350 is sufficiently high to achieve the desired arching. Lower maximum voltages are desirable for safety reasons and may facilitate a reduction of distances separating charge carrying conductors within the DPP EUV source 350 from ground.

By assuring that, during the arching in the DPP EUV source 350, the dV/dt on the electrodes of the DPP EUV source 350 is balanced, a virtual ground is created between the electrodes. This is useful, as the potential towards the (rotating) foil trap 230 is reduced to a value close to zero Volt. Moreover, the sum of the equivalent noises sources inside the high voltage cabinet that result from the dV/dt of all circuits connected to the individual electrodes of the EUV source 350 will be close to zero.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practised otherwise than as described. The descriptions above are intended to be illustrative, not limiting. Thus it will be apparent to one skilled in the art that modifications may be made to the invention as described without departing from the scope of the claims set out below.

What is claimed is:

1. A power supply for providing power to a lithography illumination source, the power supply comprising:
   a voltage source configured to provide the power;
   a transmission line configured to transmit the power from the voltage source; and
   a RF termination provided on an input end of the transmission line or an output end of the transmission line, the RF termination being configured to terminate the transmission line to reduce reflection of RF energy at the end of the transmission line.

2. The power supply of claim 1, wherein the transmission line is a coaxial cable and wherein the RF termination is provided in series with a core of the coaxial cable on the input end or the output end of the coaxial cable.

3. The power supply of claim 2, further comprising a second RF termination provided in series with a shield of the coaxial cable on the input end or the output end of the coaxial cable.

4. The power supply of claim 2, further comprising a common mode choke in series with the coaxial cable, the common mode choke being configured to pass equal and opposite currents on the core and a shield of the coaxial cable, respectively.

5. The power supply of claim 1, wherein the RF termination is configured to terminate the transmission line so that the impedance of the RF termination, as seen by the transmission line, corresponds to the characteristic impedance of the transmission line.

6. The power supply of claim 1, wherein the RF termination comprises an inductor in series with the transmission line to allow DC current flow through the RF termination.

7. The power supply of claim 1, wherein the voltage source is an un-switched voltage source configured to provide continuous DC power through the transmission line.

8. The power supply of claim 1, wherein the voltage source is a voltage source configured to provide a positive and a negative voltage to the transmission line.

9. The power supply of claim 8, wherein the transmission line comprises first and second coaxial cables, the first coaxial cable connecting said positive voltage to the illumination source and the second coaxial cable connecting said negative voltage to the illumination source.

10. The power supply of claim 9, wherein the RF termination is connected to the first coaxial cable and a second RF termination is connected to the second coaxial cable.

11. An apparatus comprising the power supply of claim 1 and an illumination source connected to the transmission line.

12. The apparatus of claim 11, wherein the illumination source is a EUV radiation source.

13. An apparatus comprising a voltage source and a lithography illumination source connected to the voltage source via a transmission line, an end of the transmission line connected to a matching network to reduce RF reflection at the end.

14. An apparatus comprising a voltage source, a lithography illumination source connected to the voltage source via a transmission line and an RF isolator between the illumination source and the voltage source.

15. The apparatus of claim 14, wherein the RF isolator is arranged to pass a DC current from the voltage source to the illumination source.

16. The apparatus of claim 14, wherein the illumination source is an EUV radiation source.

17. A lithographic apparatus comprising the apparatus of claim 14.

18. A power source for supplying power to a lithography illumination source comprising an output port with a RF termination for connecting to a transmission line having a characteristic impedance, the RF termination providing an impedance at the output port, as seen by the transmission line, that substantially corresponds to the characteristic impedance of the transmission line.

19. The power source of claim 18, wherein the power source is configured to provide a positive and a negative voltage and to provide the positive voltage to the output port, and wherein the power source comprises a second output port with a second RF termination configured to connect to a second transmission line having a second characteristic impedance, the second RF termination providing an impedance at the second output port, as seen by the second transmission line, that substantially corresponds to the characteristic impedance of the second transmission line.

20. A method of creating extreme ultraviolet (EUV) radiation, the method comprising:
   connecting a power source to a EUV radiation source via an RF isolator; and
   continuously charging a capacitor within the EUV radiation source with a DC current from the power source while the EUV radiation source intermittently discharges the capacitor.

* * * * *